United States Patent [19]

Blakely

[11] Patent Number: 5,652,507

[45] Date of Patent: Jul. 29, 1997

[54] APPARATUS AND METHOD FOR MEASURING AN AC CURRENT WHICH SATURATES THE CORE OF A CURRENT TRANSFORMER

[75] Inventor: John Herman Blakely, Asheville, N.C.

[73] Assignee: Eaton Corporation, Cleveland, Ohio

[21] Appl. No.: 594,977

[22] Filed: Jan. 31, 1996

[51] Int. Cl.$^6$ .................................................. G01R 19/10
[52] U.S. Cl. ........................ 324/127; 324/117 R; 323/356
[58] Field of Search ................................ 324/117, 117 R, 324/117 H, 127, 126, 115, 110; 323/356

[56] References Cited

U.S. PATENT DOCUMENTS

| | | | |
|---|---|---|---|
| 4,255,704 | 3/1981 | Milkovic | 324/110 |
| 4,682,100 | 7/1987 | Hagelin | 324/117 R |
| 4,847,554 | 7/1989 | Goodwin | 324/127 |
| 4,980,794 | 12/1990 | Engel | 361/187 |

Primary Examiner—Kenneth A. Wieder
Assistant Examiner—Barry C. Bowser
Attorney, Agent, or Firm—Larry G. Vandezande

[57] ABSTRACT

The dynamic range of a current transformer (CT) is increased without reducing the scaling of measurements at the low end of the dynamic range by designing the core of the CT to saturate only after about 90 electrical degrees of the maximum current to be measured. The measurements taken during this first 90 electrical degrees before the core saturates are doubled to in effect add measurements representing the mirror image of the first 90 electrical degrees. Timing of the digitized samples taken during the first 90 electrical degrees is adjusted to account for core reset energy errors, by determining the rate of change of current just after a zero crossing and selecting an empirically determined value of current for timing the start of the measurement samples.

15 Claims, 3 Drawing Sheets

APPARATUS AND METHOD FOR MEASURING AN AC CURRENT WHICH SATURATES THE CORE OF A CURRENT TRANSFORMER

BACKGROUND OF THE INVENTION

1. Field of the Invention

This invention relates to measuring ac electrical current, and in particular to a method and measurement system which extends the range of measurements made with a current transformer which saturates during operation.

2. Background Information

Current transformers (CTs) are commonly used for sensing ac electrical currents. For instance they are often used in load control and protection devices such as contactors; motor starters and controllers; circuit breakers; monitors and analyzers; and with electrical distribution systems. In many such applications the load current can have a very wide dynamic range. Unfortunately, the magnetic materials commonly available for the cores of the current transformers limit the dynamic range of the sensing device. Peak flux density is a limiting factor at the upper end of the dynamic range, while core loss/declining permeability is a limit at the lower end. For a given core material and required accuracy, these parameters limit the operating range of the current transformer. While the dynamic range could be extended by increasing the volume of the core material and/or the turns of the secondary winding, these solutions increase the size of the CT which is often critical, and also increase the cost which can be unacceptable in low end products. As many of these products are multiphase, the effects of these factors are compounded.

There is a need therefore for an improved current transformer system for current sensing.

There is a particular need for a current transformer sensing system which provides increased dynamic range for the same size device or the same dynamic range but with a smaller device.

SUMMARY OF THE INVENTION

These needs and others are satisfied by the invention which is directed to a method and apparatus for measuring ac currents with a wide dynamic range using a current transformer having a core which saturates at the high end of the wide dynamic range after about 90 electrical degrees of the ac current. Since current transformers will normally reproduce an ac wave form accurately up very close to the point of saturation only samples prior to saturation are used to measure the current in accordance with the invention. Preferably, the first 90° of the wave form, which precedes saturation, is measured and doubled or "folded" about the 90° reference to generate a representation of the entire half cycle without saturation. In this manner, the upper limit of the current that can be measured by the current transformer is doubled. This is achieved without reducing the accuracy of the measurement at the low end of the dynamic range.

Preferably, the invention utilizes a digital processor such as a microcontroller which can easily manipulate the digitized samples of the wave form for the first 90 electrical degrees to generate a desired electrical measurement such as the rms value or average value of the current.

One problem that exists where digitized samples of the wave form are used is the effect of core reset. The current transformer begins to come out of saturation when the primary current of the transformer changes polarity. This distorts the leading edge of the zero crossing which can affect the timing the digital sampling. The present invention makes an adjustment for core reset. The rate of change of the current immediately following the zero crossing of the current transformer's secondary current is determined and used to set a threshold value of current which corresponds to the primary current zero crossing point. In this manner the correct timing is maintained for the digital samples of the first 90° of the current transformer secondary current and core reset energy error is greatly reduced.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

The invention will be described as applied to a motor starter which includes current transformers for measuring load current. The load current which must be measured by these current transformers have a very wide dynamic range which can cause the cores of the current transformers to saturate. Application of the invention to a motor starter is for illustration only, and it will be appreciated by those skilled in the art that the invention has broad application to current transformers used to measure currents having wide dynamic ranges.

Figure 1:
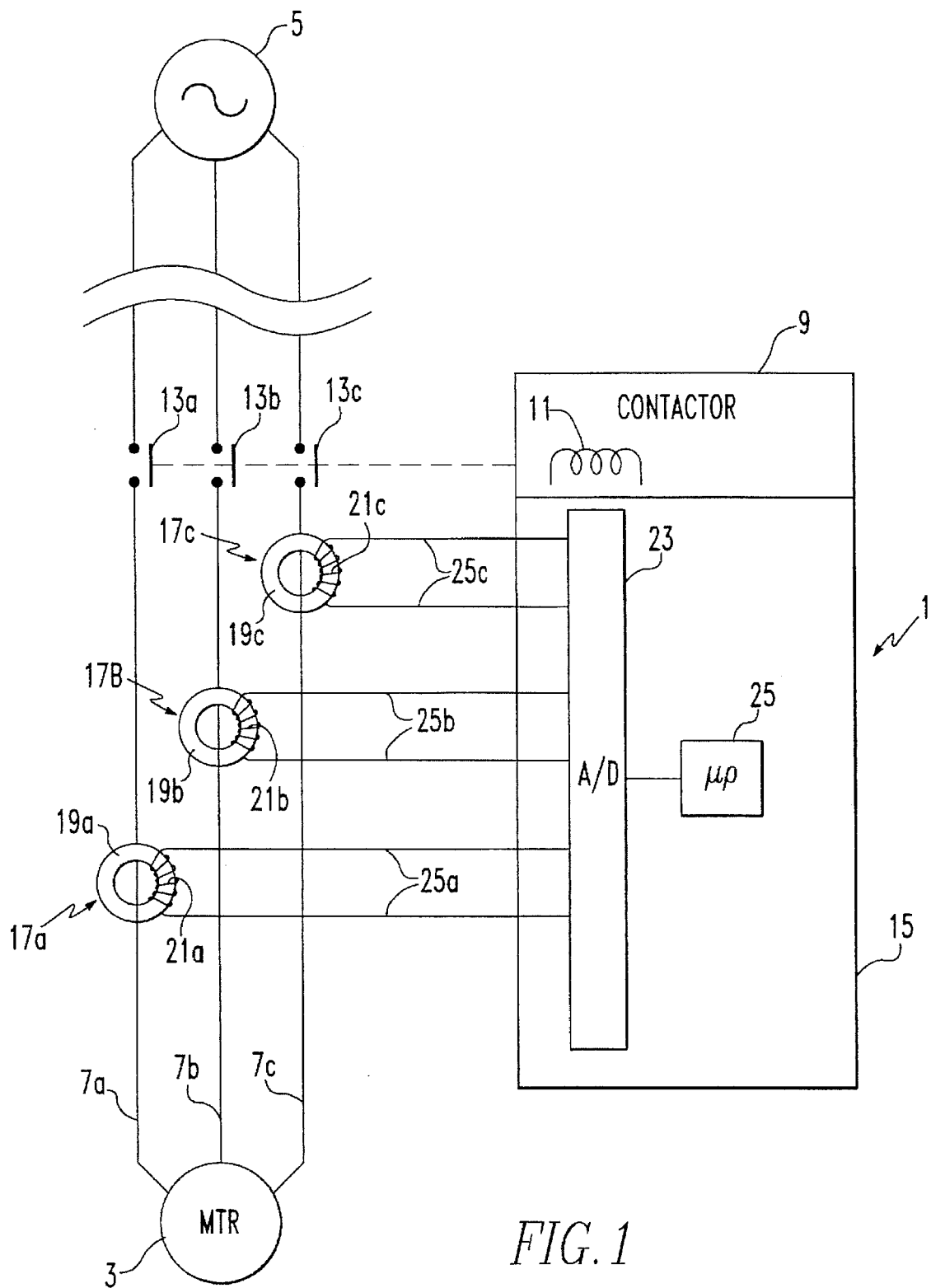
FIG. 1 is a schematic diagram of a motor starter incorporating the invention.

Referring to FIG. 1 a motor starter 1 incorporating the invention controls an electric motor 3 energized by a three-phase ac current supplied from a source 5 over three-phase conductors 7A, 7B and 7C. The motor starter 1 includes a contactor 9 incorporating a coil 11 which when energized closes the contacts 13A, 13B and 13C in conductors 7A, 7B and 7C to connect the motor 3 to the source 5.

The motor starter 1 also includes an overload relay 15 having current transformers (CTs) 17A, 17B and 17C which provide analog signals representative of the currents and the respective phase conductor 7A, 7B and 7C. Each of the current transformers includes a toroidal core 19A, 19B and 19C, respectively. The respective conductor 7A, 7B and 7C passes through the toroid to form the primary winding of the current transformer. The secondary windings 21A, 21B and 21C generate analog signals representative of the currents in the associated conductors which are digitized by an analog-to-digital (A/D) converter 23 through leads 25A, 25B and 25C. The A/D converter 23 digitizes the analog CT secondary currents at intervals controlled by a microprocessor 25. The digitized current samples are utilized by the microprocessor 25 to provide overload protection for the motor in a manner which is well known in the art. If predetermined current/time characteristics are exceeded, the microprocessor de-energizes the coil 11 of the contactor 9 to open the contacts 13A, 13B and 13C and therefore de-energize the motor 3.

Figure 2:
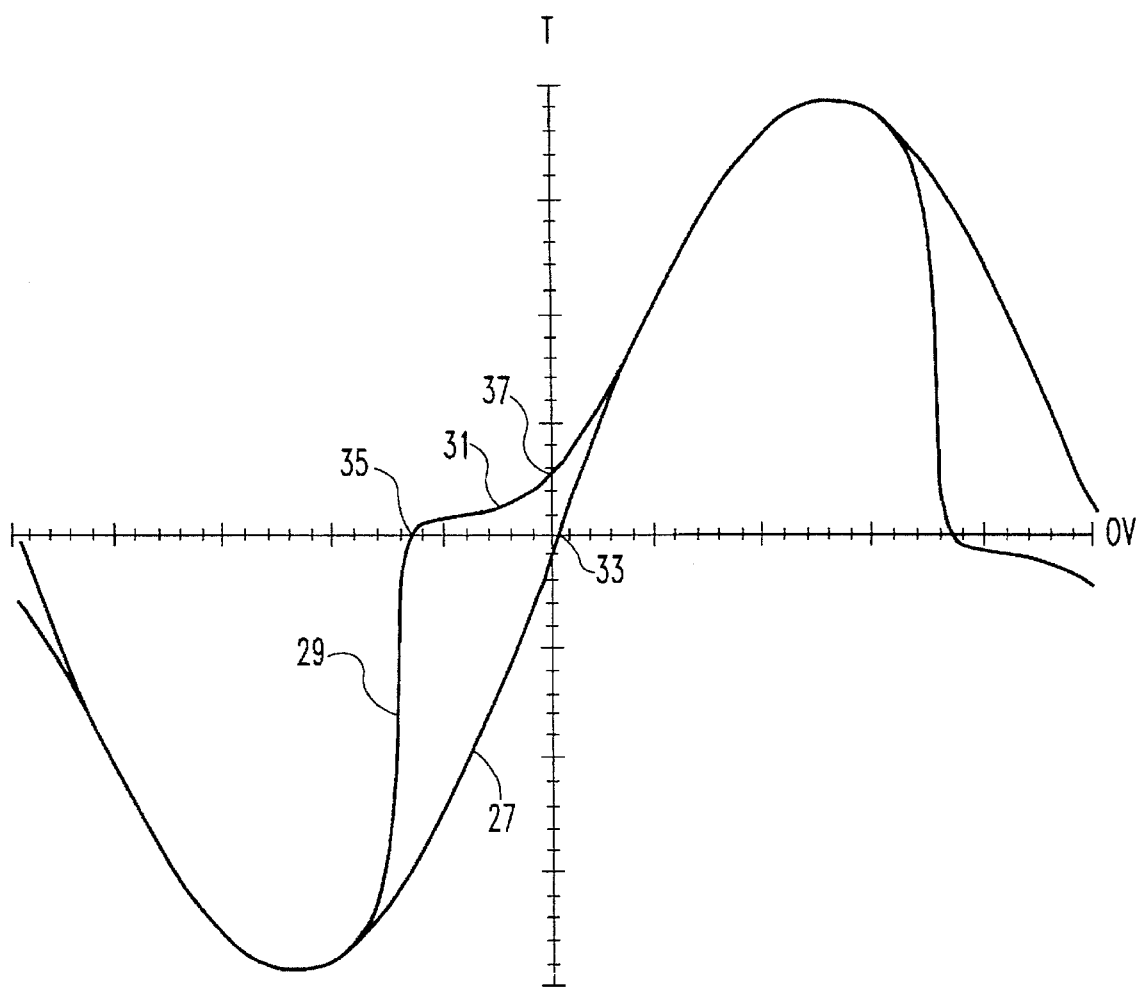
FIG. 2 is a plot illustrating the response of a current transformer which saturates just after 90 electrical degrees of the primary ac current.

As mentioned, the currents measured by the CTs 17 have a wide dynamic range. Currents at the high end of this dynamic range can saturate the cores 19 of the CTs 17. These cores are designed so that they do not saturate until after 90 electrical degrees of a zero crossing of the ac current. This condition is illustrated in FIG. 2 where the trace 27 represents the primary current applied to the CT and the trace 29 represents the secondary current. As can be seen, the core saturates just past the 90 electrical degree point and the output of the CT falls to zero. Thus, the CT even though it saturates, provides an accurate measure of the current up to the saturation point. Thus, in accordance with the invention, digital samples are taken of the CT secondary current in the first 90° after a zero crossing. These samples are taken synchronously with the ac current, that is they are taken at prescribed angular points in the wave form. In the exemplary embodiment of the invention 8 samples are taken during the first 90 electrical degrees. The following is a list of the angular degrees after a zero crossing at which the samples are taken:

| 1 | 5.625 |
|---|---|
| 2 | 17.125 |
| 3 | 28.625 |
| 4 | 40.125 |
| 5 | 51.625 |
| 6 | 63.125 |
| 7 | 74.625 |
| 8 | 86.125 |

The values of the secondary current measured by each of these samples can be doubled to mirror the values during the second 90°. Thus, in order to calculate the rms value of the current, the microprocessor squares each of the sample values, sums the squares, doubles the sum, and then takes the square root of the product which is rescaled for the number of samples, to produce a signal representative of the rms value of the current. If the average value of the current is desired, the sum of the samples of the value can be divided by the number of samples.

As mentioned, core reset distorts the CT secondary current. It can be seen at 31 in FIG. 2 that the secondary current begins to rise in a positive direction before the negative to positive zero crossing at 33 of the CT primary current. If the zero crossing at 35 of the CT secondary current were used for timing the sampling of the secondary current by the microprocessor there would be a serious error in the measured value of current. Accordingly, the invention adjusts the initiation of the timing of the samples to more accurately align the sampling with the true waveform. This is accomplished in accordance with the invention by estimating the value of the CT secondary current at the point 37 corresponding in time to the point where the CT primary current has a zero crossing. In the exemplary embodiment of the invention this is done by determining the slope of the CT secondary current just after its zero crossing and using that rate of change of current to select a value for the CT secondary current at the point 37. The microprocessor then monitors the CT secondary current and when it reaches the threshold value indicating a zero crossing of the CT primary current, timing for the samples is initiated. The rate of change of the current or slope of the trace 29 is determined by measuring the CT secondary current at two points closely spaced in time and then determining the ratio of these two values. Samples for determining the slope and when the CT secondary current has reached the threshold value are performed at a higher sampling rate than the 8 measurement samples are taken at. For instance, at 50 µSec intervals.

Figure 3:
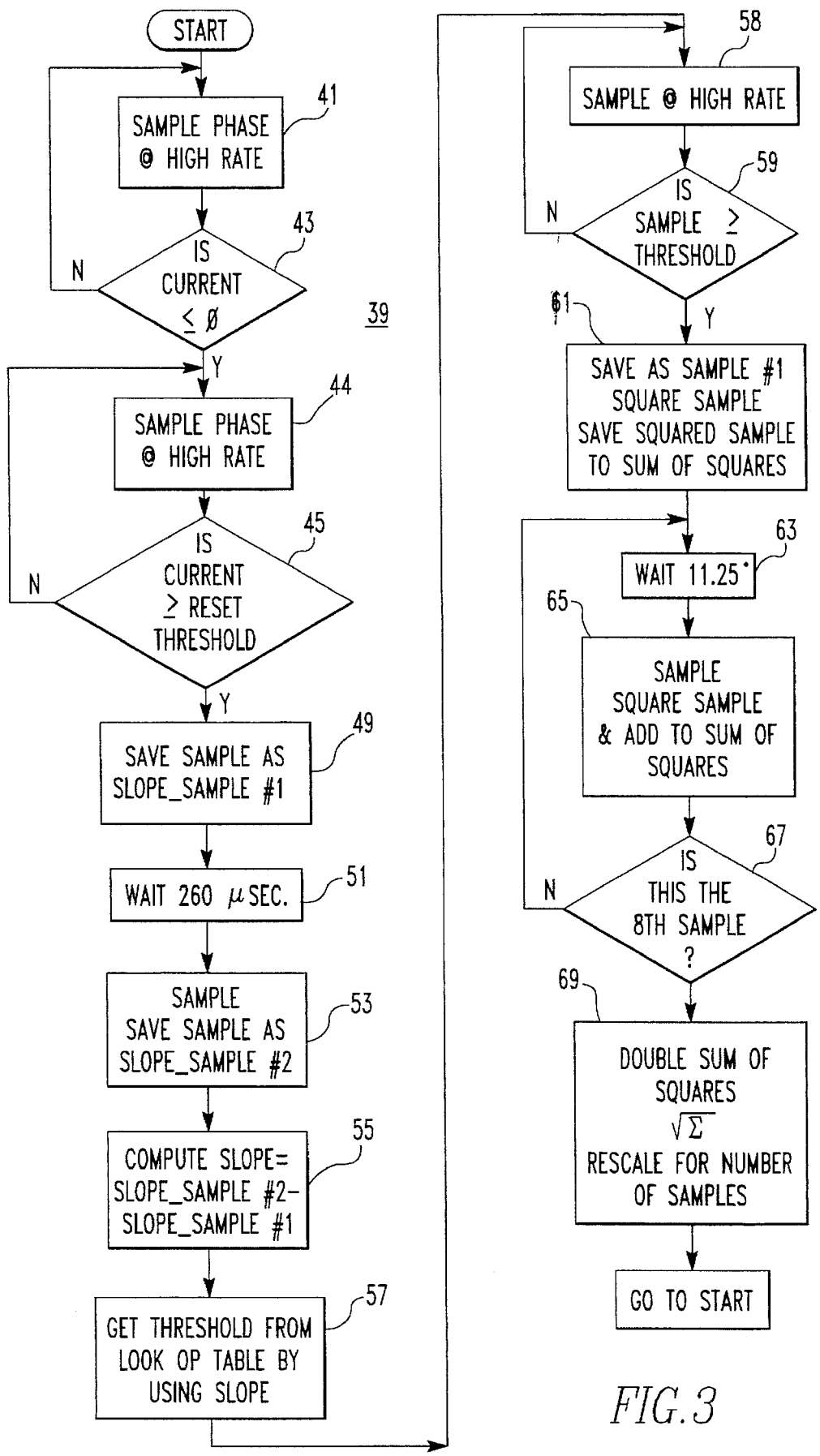
FIG. 3 is a flow chart of a computer program used in implementing the invention.

FIG. 3 illustrates a flow chart 39 for a computer program used by the microprocessor 25 to implement the invention. Samples are taken initially at the high rate at 41 for locating the zero crossing of the CT secondary current. In the exemplary embodiment of the invention the microprocessor 25 only reads currents of a single polarity, hence, the zero crossing of the CT secondary is detected by observing when the CT secondary current goes from negative to positive at 43. When this occurs, samples are taken at the high rate at 44 until a predetermined threshold (2.3% of full scale in the example) is reached at 45. This measurement of the CT secondary current is saved at 49 as a first slope sample. After waiting 260 microseconds at 51, a second measurement is taken at 53 and used at 55 together with the first measurement to compute the slope of the CT secondary current. This slope or rate of change of the CT secondary current is then used to select an empirically or analytically determined value from a look-up table at 57 for the CT secondary current at a point corresponding in time to the 5.6° point of the CT primary current. The CT secondary current is then sampled at the high rate at 58 and compared to this selected value at 59. The program loops back and continues to sample at the high rate at 58, until the CT secondary current equals or exceeds the selected value. This sample is saved at 61 as the first measurement sample, squared and used to initiate a series of squares. Sampling at the measurement rate is then begun at 63. Each additional sample value is squared and added to produce the sum of squares at 65. When 8 samples have been gathered at 67 the sum of squares is doubled and the square root of the product is taken at 69 to produce a value which is output as the rms value of the current. The program then returns to start and looks for the next zero crossing.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for measuring an ac current having a given dynamic range, comprising:

a current transformer having a primary winding to which said ac current is applied, a secondary winding generating a secondary current proportional to said ac current, and a core coupling said primary winding and said secondary winding, said core saturating at a high end of said given dynamic range of said ac current more than 90 electrical degrees after a zero crossing of said ac current; and control means connected to said secondary winding for generating a signal representing a selected measurement of said ac current from measurements of said secondary current taken after said zero crossing but before saturation of said core by said ac current applied to said primary winding.

2. The apparatus of claim 1 wherein said control means comprises means generating said signal representing said selected measurement of said ac current from measurements of said secondary current taken only within 90 electrical degrees after said zero crossing.

3. The apparatus of claim 2 wherein said control means comprises means generating a signal representing an rms value of said ac current as said selected measurement.

4. The apparatus of claim 2 wherein said control means comprises means generating a signal representing an average value of said ac current as the selected measurement.

5. The apparatus of claim 1 wherein said control means includes means adjusting for reset energy in said core and using measurements of said secondary current only within about 90 electrical degrees after said zero crossing.

6. The apparatus of claim 1 wherein said control means comprises digital processing means including means generating said signal representative of said selected measurement from digitized samples of said secondary current taken during about said 90 electrical degrees after said zero crossing, and adjustment means determining timing of said digitized samples to adjust for core reset energy.

7. The apparatus of claim 6 wherein said adjustment means comprises means detecting said zero crossing of said secondary current, means determining rate of change of said secondary current just after said zero crossing, and means determining timing of said digitized samples from said rate of change of said secondary current.

8. The apparatus of claim 7 wherein said digital processing means includes digitizing means selectively generating said digitized samples of said secondary current at a first rate, and at a second rate which is faster than said first rate, and wherein said means generating said signal representative of said selected measurement uses said digitized samples generated at said first rate, and wherein said adjustment means utilizes said samples generated at said second, faster rate.

9. The apparatus of claim 2 wherein said control means comprises digital processing means including means generating said signal representative of said selected measurement from samples digitized at a first sampling rate, and adjustment means using samples digitized at a second sampling rate faster than said first sampling rate to initiate sampling at said first rate relative to said zero crossings of said secondary current taking into account effects of reset energy in said core.

10. The apparatus of claim 9 wherein said means generating said signal representative of said selected measurement comprises means generating digitized samples at said first rate at specified electrical degrees of said first 90 electrical degrees of said ac current, and said adjustment means comprises means using digitized samples taken at said second rate from a slope of a signal representing said secondary current derived from samples taken at said second sampling rate.

11. A method of measuring an ac current with a wide dynamic range using a current transformer having a core which saturates at a high end of said dynamic range after about 90 electrical degrees of said ac current, said method comprising the steps of:

detecting zero crossings of current produced by said current transformer;

generating samples of said ac current generated by said current transformer only within about 90 electrical degrees after a zero crossing of said ac current; and determining a selected value of said current from said samples.

12. The method of claim 11 wherein said step of determining comprises determining an rms value of said ac current from said samples.

13. The method of claim 11 wherein said step of determining comprises determining an average value of said ac current from said samples.

14. The method of claim 11 wherein said step of generating samples of said ac current comprises generating said samples at specified time intervals, and adjusting taking of said samples to account for core reset energy.

15. The method of claim 14 wherein said adjusting comprises determining a rate of change of said current just after said zero crossing and selecting a value of said current for initiating generation of said measurement samples from said rate of change of current.

\* \* \* \* \*